United States Patent [19]

Bütefisch et al.

[11] Patent Number: 5,079,730
[45] Date of Patent: Jan. 7, 1992

[54] PROCESS AND APPARATUS FOR THE EVALUATION OF TIMING SIGNALS WITH PERIODIC COMPONENTS OR PULSE SEQUENCES

[75] Inventors: Karl A. Bütefisch, Bovenden; Jürgen Kompenhans, Gleichen, both of Fed. Rep. of Germany

[73] Assignee: Deutsche Forschungsanstalt für Luft -und Raumfahrt e.V., Fed. Rep. of Germany

[21] Appl. No.: 406,790

[22] Filed: Sep. 13, 1989

[30] Foreign Application Priority Data

Sep. 23, 1988 [DE] Fed. Rep. of Germany ....... 3832336

[51] Int. Cl.$^5$ ............................................ G06F 15/332
[52] U.S. Cl. ................................... 364/569; 364/576; 359/559
[58] Field of Search ............... 364/484, 822, 525, 827, 364/569, 576; 350/356, 358, 96.14, 374, 162.12, 162.13

[56] References Cited

U.S. PATENT DOCUMENTS

| | | | |
|---|---|---|---|
| 3,872,293 | 3/1975 | Green | 350/162.12 |
| 3,944,820 | 3/1976 | Stotts | 350/96.14 |
| 4,418,394 | 11/1983 | Tai | 364/746 |

OTHER PUBLICATIONS

Robert H. Kingston, signal correlation using a one-dimensional electroabsorptive CCD spatial light modulator, Jul. 84, 954–961, proceedings of the IEEE.

*Primary Examiner*—Thomas G. Black
*Attorney, Agent, or Firm*—Hopkins & Thomas

[57] ABSTRACT

The invention relates to a process for the evaluation of time signals with periodic components or pulse sequences, in which the time signal is digitized sectionally, represented on a light modulator transilluminated with coherent light, focused in a Fourier plane and the image in the Fourier plane, which contains the frequency of the time signal, is further processed. The first section of the digitized time signal is written into a line (26) of the light modulator (6). Each further section is represented in a further line (26). The apparatus for carrying out the process has a digitizing device and a controller representing a sectionally digitized time signal on the light modulator. The light modulator is transilluminated by coherent light of a light source. The light is focused on a screen arranged in a Fourier plane by an optical system. A line controller is provided as controller.

17 Claims, 3 Drawing Sheets 5,079,730

PROCESS AND APPARATUS FOR THE EVALUATION OF TIMING SIGNALS WITH PERIODIC COMPONENTS OR PULSE SEQUENCES

FIELD OF THE INVENTION

The invention is based on a process for the evaluation of time signals with periodic components or pulse sequences, in which the time signal is digitized sectionally, represented on a light modulator transilluminated with coherent light, focused in a Fourier plane and the image in the Fourier plane, which contains the frequency of the time signal, is further processed. The invention at the same time shows an apparatus for carrying out the method with a digitizing device and a controller representing a sectionally digitized time signal on a light modulator, the light modulator being transilluminated by coherent light of a light source, and with an optical system focusing the light on a screen arranged in the Fourier plane.

BACKGROUND OF THE INVENTION

Time signals with periodic components, for example sinusoidal components or pulse sequences, occur frequently in technical applications, for example in telecommunication, in range finding applications with radar or echo, in structural dynamics, in speed measurement with the aid of laser-Doppler anemometry or with the laser-2-focus method as well as in transit-time measurement by means of ultrasonic methods. From the time signals, then, any existing fundamental frequency or a pulse interval is determined, with the aid of which the parameter sought can then finally be determined.

A method of the type described at the beginning is known from applicant's own, unpublished application. According to the available rows of the light modulator, the time signal is divided into individual sections and digitized. This section of the digitized time signal is then represented on the light modulator by the individual elements of the light modulator being switched to translucent or non-translucent. This light modulator is then transilluminated with coherent light and the light is focused in the Fourier plane. The Fourier-transformed image, that is a pattern of dots, is then produced in the Fourier plane, the spacing of the dots neighboring a central dot being proportional to the frequency of the time signal. What is advantageous about this known method is that the Fourier-transformed image of the section of the time signal is represented virtually without delay. Consequently, a very fast evaluation is possible. What is disadvantageous, however, is that the time signal can only be represented sectionally on the light modulator, since the latter only has a finite number of columns. On account of this, dead times occur in the case of prolonged and high-frequency time signals, i.e. this means that not the complete time signal can not be evaluated. These dead times are to be explained by the fact that evaluation first has to take place after each sectionally represented time signal in order subsequently to be able to represent a new section of the time signal on the light modulator. The timing signal arising in this time is lost. It is also disadvantageous that no evaluation of long time signals is possible, in order to obtain an averaged result, with this known method. A simultaneous evaluation of time signals which originate from different signal sources, such as is the case for example in stationary vibration tests with various vibration pickups, is also not possible by optical means. In order to obtain such an average value, it is necessary to carry out the averaging in a possibly on-line computer later. The simultaneous evaluation of a number of time signals is not possible. Also, the simultaneous recording and representation of the frequencies of a number of time signals is not possible.

It is also known to evaluate the time signals with an FFT analyser. The fast-Fourier transformation of the time signal is carried out in such a commercially available FFT analyser What is disadvantageous is that such FFT analysers have to manage with a limited number of interpolation points, usually about 512 in the case of not very fast devices, about 64 in the case of fast devices, meaning that the fundamental frequency is no longer detectable if there is considerable noise, i.e. a low signal-to-noise ratio. What is also disadvantageous is that the computing time is relatively long. Where high frequency signals are involved, sections which are not recorded occur between the individual sections of the time signal in the case of these FFT analysers as well. The dead time arises mainly from the time which the computer requires for the evaluation or for the FFT analysis. There is, of course, the possibility of largely eliminating this dead time by using a plurality of FFT analysers, but this entails a considerable expenditure. Furthermore, such FFT analysers are relatively expensive, meaning that for this reason alone normally a plurality of FFT analysers cannot be used.

SUMMARY OF THE INVENTION

The invention is based on the object of further developing a process and an apparatus for the evaluation of time signals with periodic components and pulse sequences of the type described at the beginning in such a way that even long time signals or many signals simultaneously can be evaluated without any dead time. Furthermore, the process is also to supply reliable results even in the case of a low signal-to-noise ratio.

According to the invention, this is achieved by the first section of the digitized time signal being written into a line of the light modulator, and by each further section being represented in a further line. The process is based on an optical Fourier analysis. The time signal is subdivided into individual sections and these sections are digitized. The length of the individual sections is dependent on the number of columns of the light modulator used. The first section of the digitized time signal is then written into the first line of the light modulator, so the light modulator is not, as known in the prior art, already completely filled with one section of the time signal; instead only a single line of the light modulator, having a multiplicity of lines, is filled. The following sections of the time signal are then written into the respective line of the light modulator. The light modulator is then transilluminated with coherent light and the light is focused in the Fourier plane. A pattern of dots is then produced in the Fourier plane, the spacing of the dots neighboring a central dot being proportional to the frequency of the timing signal. From this frequency, the parameters sought, thus for example the speed, can then be determined. It is to be emphasized in particular that not only a single section of the time signal is evaluated here but that a multiplicity of sections are evaluated simultaneously. The average value of the frequencies of the individual sections, that is the fundamental frequency of the time signal, is then obtained in the Fourier plane. Dead times do not occur even in the case of long-time signals, since the light modulator can be fully covered continuously. Consequently, the possibility is obtained of evaluating the time signals virtually as they occur. The measurements can thus be monitored directly, which is particularly important in structural dynamics investigations, for example. Harmful frequencies or pulse intervals are detected immediately and the test can be stopped. But it is also of advantage to obtain a direct display of measured results without any appreciable delay in other tests, for example in speed measurement on the basis of laser-Dopper anemometry. Irregularities can be detected immediately and eliminated. This process can also be realized relatively inexpensively, no expensive high-speed processors or the like are necessary.

Even prolonged time signals can be evaluated without dead time. If the light modulator is fully covered, i.e. all lines of the light modulator are occupied, the writing operation can be continued, starting with the first line, and consequently the lines of the light modulator are written over. A continuous reading into the light modulator therefore takes place. The Fourier-transformed image, that is the pattern of dots, represented in the Fourier plane then always contains the fundamental frequency of the sections of the time signal represented on the light modulator. There is consequently the possibility of reading off changes in the fundamental frequency (for example due to turbulent speed fluctuations in laser-Dopper anemometry) directly by a corresponding change in the Fourier-transformed image.

A plurality of time signals originating from different signal sources in each case can be read into different lines of the light modulator. The time signals may in this case originate from, for example, different measuring pick-ups and extend over one or more sections. These individual sections are then read into one or more lines in each case, dependent on the length of the time signal, in the light modulator. The Fourier-transformed image then reproduces the average value of the individual spectra.

For digitization of the time signal, a threshold value may be given, the time signal having a first amplitude level if the threshold value is exceeded and a second amplitude level if it is not exceeded. The time signal is thus digitized in such a way that only two amplitude levels occur, which are then represented in the light modulator as translucent or non-translucent. One then refers to a clipped time signal. If the amplitude of the time signal to be digitized exceeds the threshold value, the digitized time signal is set, for example, to one, if on the other hand it does not exceed the threshold value, it is set to zero. The digitized time signal then represents a binary signal with the values zero and one on the time axis. In the case of a sinusoidal oscillation, for example, the first half-period would be assigned the value one, the second half-period the value zero. The threshold value is dependent on the respective problem and is to be set accordingly. This type of digitization is to be carried out whenever the light modulator used is binary, i.e. whenever gray shades cannot be represented on the light modulator. The time signal is reduced by this digitization to the information required, i.e. to the frequency. Since, however, only this frequency is sought, generally this form of representation is fully adequate. A complex, slow digitization device is not needed in this case. Consequently, a high digitization rate is achieved, so that even very high frequencies are amenable to investigation regarding a fundamental frequency. If, on the other hand, the light modulator used can represent gray shades, the time signal is discretized into the same number of amplitude levels as the number of gray shades the light modulator can process. In both cases, the time signal is then written sectionally into a single line of the light modulator.

As already mentioned above, a pattern of dots, i.e. the Fourier-transformed image, is produced in the Fourier plane, the spacing of the individual dots being proportional to the frequency of the time signal. Normally, the spacing of the two dots neighboring the central dot is recorded and further processed accordingly. In some investigations, however, it is adequate if a change in the frequency of the time signal is registered. In this case, it is expedient to observe only the one locus which corresponds to the frequency to be monitored. If the fundamental frequency of the time signal changes in relation to the given frequency, the one dot of the pattern of dots moves out of the locus to be observed. Consequently, a reliable monitoring of a given fundamental frequency is possible.

The time signal and/or the Fourier-transformed time signal focussed in the Fourier plane can be stored. The stored time signal and/or the Fourier-transformed time signal then serves for comparisons which may be made later. It is also possible in this way to determine the fundamental frequency of time signals occurring at different points in time by representing the various time signals on the light modulator and evaluating them accordingly.

The apparatus for carrying out the process is characterized by a line controller being used as controller. The line controller is consequently designed and arranged in such a way that it writes the digitized time signal line-by-line into the light modulator. Furthermore, a plurality of digitizing devices may advantageously be provided, a scanning means being arranged, which directs the digitized time signals to different line controllers and different light modulators. This is particularly appropriate whenever there are extremely long time signals with high frequency, meaning that a single digitizing device can no longer process the time signal continuously. In such a case, a plurality of digitizing devices may be provided, which digitize the time signal alternately and are then connected via the scanning means to the line controller of the light modulator.

The optical system may be designed and arranged in such a way that it represents on the screen all the lines of the light modulator and/or individual selected lines. There is consequently the possibility of carrying out not only averaging over all individual spectra represented on the light modulator but also a line-by-line averaging. Then the Fourier-transformed image corresponding to each line is represented in the Fourier plane, either arranged for each line successively or else simultaneously line-by-line.

BRIEF DESCRIPTION OF THE DRAWINGS

The invention is described further with reference to the preferred exemplary embodiments, in which.

DETAILED DESCRIPTION

Figure 1:
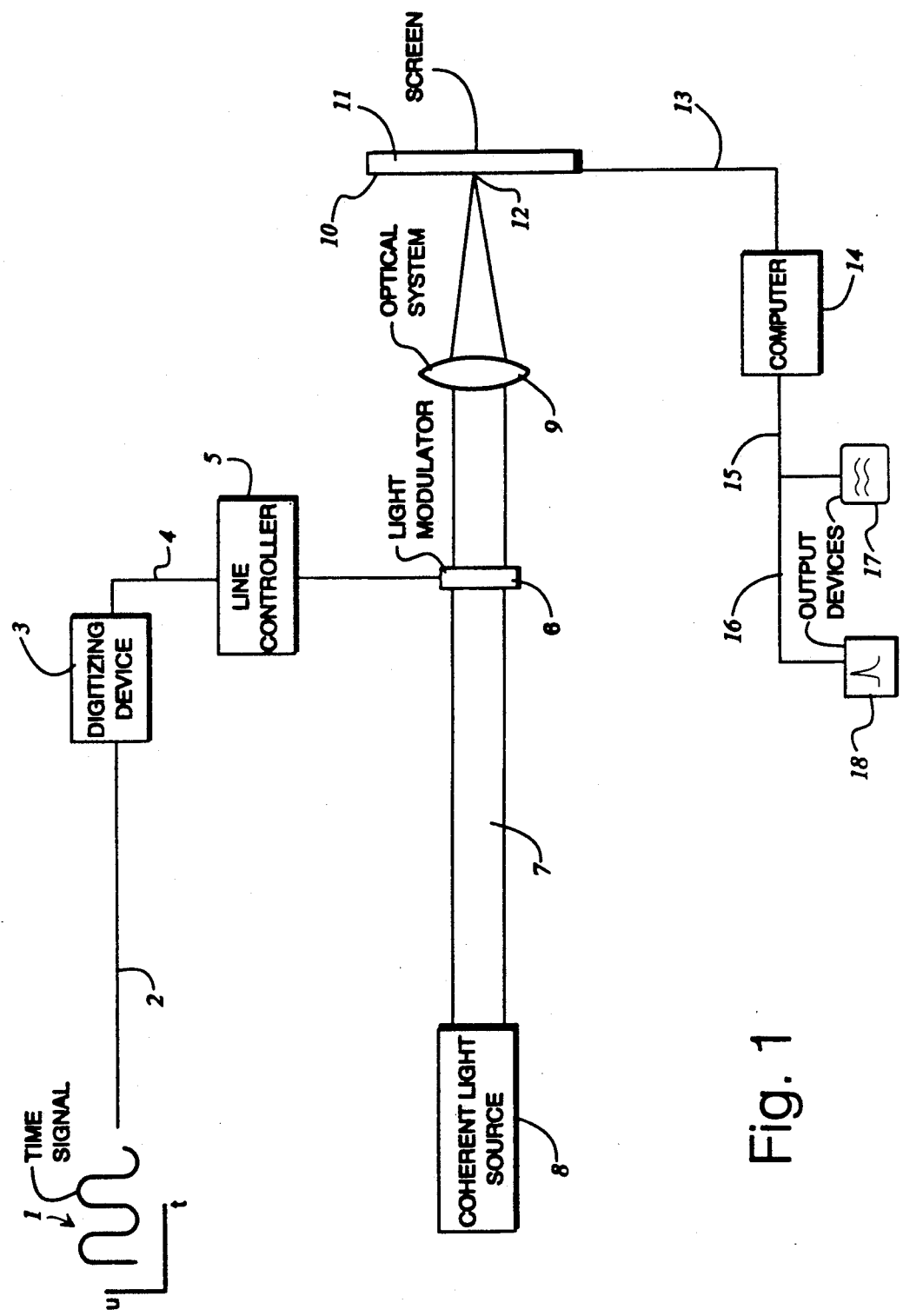
FIG. 1 shows a set-up for carrying out the process, in a diagrammatic way.

An apparatus for carrying out the process according to the invention is represented in a diagrammatic way in FIG. 1. A time signal 1, which is supplied by means of measurement or the like (not shown here any further), is fed via a line 2 to a digitizing device 3. In the digitizing device 3, the time signal 1 is digitized, as later described, and subsequently passed on via a line 4 to a line controller 5. The line controller 5 controls a light modulator 6 in such a way that the digitized time signal 1 is written into a line of the line modulator 6. A light source 8 emitting a coherent light 7 is arranged in such a way that the coherent light 7 transilluminates the light modulator 6. Behind the light modulator 6 there is arranged an optical system 9, which focuses the coherent light 7 in a Fourier plane 10. A screen 11, which may be designed as a line camera or the like, is arranged in the Fourier plane 10. A Fourier-transformed image 12 of the time signal is formed on the screen 11. The screen 11 is in connection via a line 13 with a computer 14, on which the further evaluation is carried out. The result is then passed on via lines 15 and 16 to output devices 17 and 18 and is represented on the output devices 17 and 18. The output devices 17 and 18 may, for example, be a terminal or a plotter.

Figure 2:
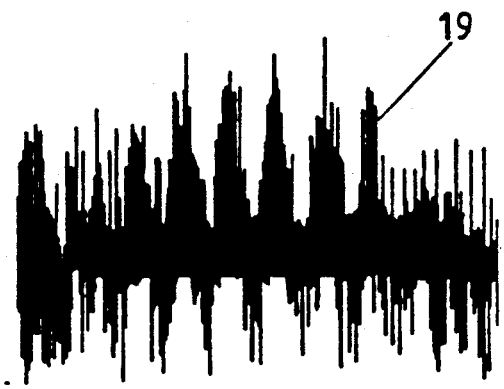
FIG. 2 shows a noisy time signal.
Figure 3:
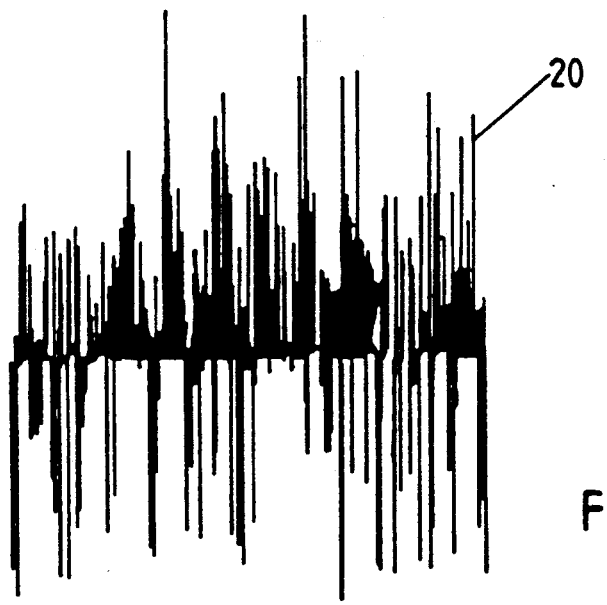
FIG. 3 shows a very noisy time signal.
Figure 4:
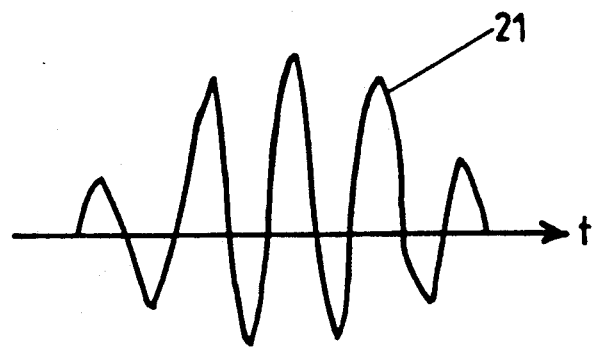
FIG. 4 shows a diagrammatic representation of a time signal.
Figure 5:
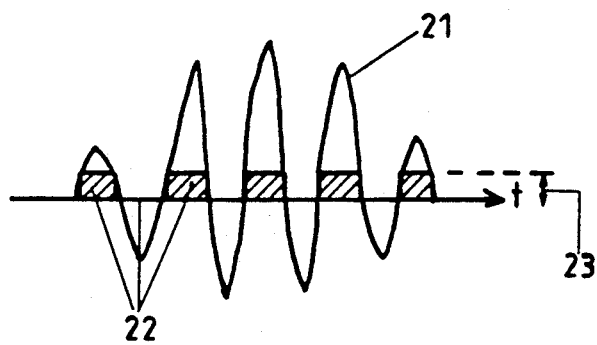
FIG. 5 shows a first possibility of digitizing the time signal.
Figure 6:
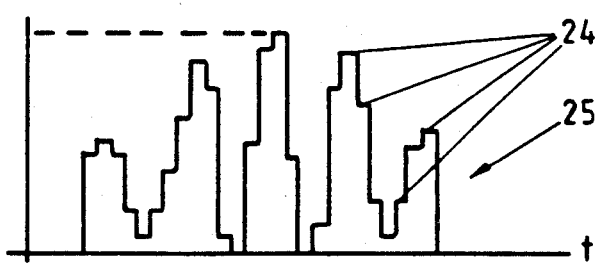
FIG. 6 shows a second possibility of digitizing the time signal.
Figure 7:
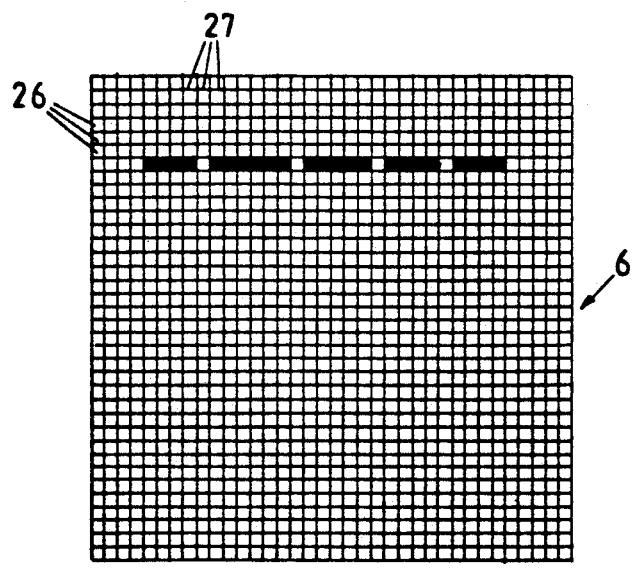
FIG. 7 shows a diagrammatic representation of a light modulator.

The operating principle is now to be explained below in further detail. The time signal 1 is made available by a means of measurement or the like and is to be investigated with regard to its fundamental frequency. Due to undesired interference, such as noise or the like, time signals 19 or 20 are received, see FIGS. 2 and 3, with which the frequency is not readily apparent. The time signals 19 and 20 represented in FIGS. 2 and 3 form only one section of the actually existing time signal, which lasts considerably longer over the course of time. The time signal 19, 20 is fed via the line 2 to the digitizing device 3. To be able to explain better the operation of the digitizing device 3, a time signal 21, see FIG. 4, is assumed, which has no interference components. In the simplest case, the time signal 21 is clipped, so that the digitized time signal 22 has only two amplitude levels, as represented in FIG. 5. For this, a threshold value of the amplitude 23 is given, which is fixed, depending on the respective problem in question. If the amplitude of the time signal 21 is greater than the threshold value 23, the digitized time signal 22 is set, for example, to one, if the amplitude of the time signal 21 is less than the threshold value 23, the digitized time signal 22 becomes zero. The time signal 21 is therefore represented in binary form. Another possibility of digitizing the time signal 21 is represented in FIG. 6. Here, the time signal 21 is no longer shown in binary form, but is divided into a multiplicity of amplitude levels 24. A digitized timing signal 25 received in such a form has the advantage that, in contrast to the binary digitized signal 22, it has even more information on the amplitude of the time signal 21. Generally, however, it is already adequate to convert the time signal 21 into a binary digitized time signal 22. The choice, whether a binary conversion into the digitized time signal 22 or a conversion into the digitized time signal 25 with a number of amplitude levels 24 is carried out, is primarily dependent on the light modulator 6 used. If the light modulator 6 can only represent two states, for example translucent and non-translucent, the time signal 21 must be converted into the binary digitized time signal 22. However, light modulators 6 which allow a gray value representation are also known. This means that every dot on the light modulator 6 can assume different gray colorations or gray shades on the light modulator 6. Depending on the number of gray shades of the available light modulator 6, the amplitude levels 24 are then determined and the time signal 21 is digitized accordingly. The line controller 5, to which the digitized time signal 22 or 25 is fed, undertakes the actuation of the light modulator 6 according to the digitized time signal 22 or 25. The light modulator 6 is represented highly diagrammatically in FIG. 7. The light modulator 6 is divided into lines 26 and columns 27. This produces the screening drawn here, which of course does not occur like this in reality. Each dot of the light modulator 6 is uniquely defined by specifying the particular line 26 and the column 27 and can be actuated by the line controller 5. The line controller 5 then actuates the light modulator in such a way that the digitized time signal 22 or 25 is written into a line 26 of the light modulator 6. Such a fully covered line is represented in FIG. 7. Normally, of course, with empty light modulator 6, the digitized time signal 22 or 25 is written into the first line 26, and starting at the first column 27. However, it is also possible to begin at the last line 26 and the last column 27. As represented in FIG. 4, the time signal 21 corresponds only to one section of the actual time signal, which extends over a longer time. Once the first section has been written into the first line of the light modulator, the following sections are written into the next-following lines respectively of the light modulator. When all lines are fully covered, the lines are successively written over again, starting with the first line. A different way is also possible: once the first section has been read into the light modulator, the next section is represented on the light modulator 6 until the respective line 26 is fully covered. When starting in the first line 26 and in the first column 27, the fully covered line 26 is then shifted down, so that new sections of the time signal 21 can then in turn be written into the first line 26. This procedure takes place continuously. It goes without saying that the digitizing device 3 and the line controller are adapted accordingly to the respective writing procedure. In the case where the digitizing device 3 or the line controller 5 cannot operate with the required frequency, a plurality of these devices may also be provided, which are then actuated via a corresponding scanning means (not shown here). It is consequently possible to represent the time signal 21 on the light modulator 6 without dead time, i.e. without loss of sectional information of the said signal, even in the case of long time signals 21. It will also be conceivable for not only one time signal 21 but a multiplicity of time signals, which originate from different signal sources, to be represented simultaneously or virtually simultaneously on the light modulator 6. The average value of the frequencies of the time signals represented on the light modulator 6 is then produced in the Fourier plane 10 by means of the optical system 9. The averaging, that is the averaged fundamental frequency, is produced automatically, computing operations or the like are no longer necessary. It goes without saying that the light modulator 6 does not necessarily have to be fully covered in all cases, but that columns 27 and lines 26 may also remain empty if only a limited number of time signals 21 or only a relatively short time signal 21 is to be evaluated. In the case of a continuous full writing of the light modulator 6 with corresponding cyclical writing to the lines 26, information on any change there may be on the fundamental frequency is obtained from the Fourier-transformed image 12.

Figure 8:
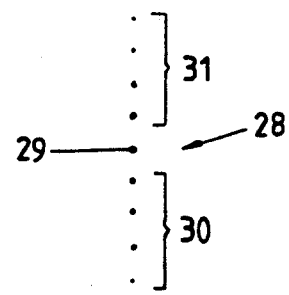
FIG. 8 shows a pattern of dots produced in the Fourier plane.

The Fourier-transformed image 12 obtained with the optical system 9 then consists of a pattern of dots 28, which has a central dot 29 and neighboring dots 30 and 31 (FIG. 8). The spacing of the neighboring dots 30 and 31 is directly proportional to the average frequency of the time signals 21 represented on the light modulator 6. If there is no average frequency, that is no fundamental frequency of the time signals represented on the light modulator 6, the Fourier-transformed image 12 is represented as a diffuse light spot. The pattern of dots 28 or the diffuse light spot in the absence of a common fundamental frequency is recorded on the screen 11. The screen 11 may also be designed as a line camera or the like, but it is also possible that, for the monitoring of a fixed given fundamental frequency, just one photocell is used. The signals from the screen 11 are then fed to the computer 12, which calculates from the spacing of the pattern of dots 28 or the spacing between the neighboring dots 30 and 31 from the central dot 29 the frequency of the time signal 21 and, from this, the other parameters which may be sought, such as speed or the like. Statements on fluctuations in the fundamental frequency can be made from the geometrical shape of the dots (circle, oval). If a correspondingly modified optical system 9 is used, the individual spectra belonging to the lines appear in the form of the patterns of dots like FIG. 8, but as line patterns arranged one under the other according to the number of lines, that is not all focused onto one line. In this case, the screen 11 is designed as a surface-area video camera or the like. The results are then represented on the output devices 17 and 18, meaning that a continuous monitoring is possible.

While the invention has been disclosed in accordance with a preferred embodiment, it should be apparent to persons skilled in the rt that variations and modifications of the disclosed embodiments can be made without departing from the scope and spirit of the invention, as set forth in the following claims.

List of Reference Numerals

1 = time signal
2 = line
3 = digitizing device
4 = line
5 = line controller
6 = light modulator
7 = coherent light
8 = light source
9 = optical system
10 = Fourier plane
11 = screen
12 = Fourier-transformed image
13 = line
14 = computer
15 = line
16 = line
17 = output device
18 = output device
19 = time signal
20 = time signal
21 = time signal,
22 = digitized time signal
23 = threshold value
24 = amplitude level
25 = digitized time signal
26 = line
27 = column
28 = pattern of dots
29 = central dot
30 = neighboring dot
31 = neighboring dot

We claim:

1. A process for the evaluation of time signals with periodic components such as periodic pulse sequences, in which the time signal is digitized sectionally, represented on a light modulator having a plurality of lines and wherein the light modulator is transilluminated with coherent light that is subsequently focused to form an image in a Fourier plane, the image in the Fourier plane, which contains the frequency of the time signal, being further processed to extract the frequency information contained therein, and wherein the first digitized section of the time signal (22,25) is represented in a first line (26) of the light modulator (6), and wherein successive digitized sections of the time signal are represented in successive lines (26) of the light modulator (6).

2. The process as claimed in claim 1, and wherein each digitized section of the time signal is represented in a line of the light modulator through a writing operation and wherein when the lines of the light modulator (6) are filled with representations of respective digitized sections of the time signal, the writing operation starts again with the first line (26) and continues with successive lines until the lines of the light modulator (6) are written over.

3. The process as claimed in claim 1 wherein a plurality of time signals (19, 20), originating from different signal sources in each case, are represented in different lines (26) of the light modulator (6).

4. The process as claimed in claim 1 wherein a threshold value (23) is given for the digitization of the time signal (19, 20), and wherein the time signal (22, 25) has a first amplitude level (24) if the threshold value (23) is exceeded and a second amplitude level (24) if the threshold value (23) is not exceeded and consequently corresponds to a digitization of the time signal on two amplitude levels (binary levels).

5. The process as claimed in claim 1 wherein the time signal (19, 20) is digitized into a multiplicity of amplitude levels (24).

6. The process as claimed in claim 1 wherein, for monitoring a given fundamental frequency of the time signal (19, 20), only the locus within the Fourier plane (10) corresponding to the fundamental frequency is observed with movement of a preselected portion of the image out of the locus indicting a deviation from the fundamental frequency.

7. The process as claimed in claim 1 wherein the time signal (19, 20) and/or the image in the Fourier plane (10) is stored for future use.

8. An apparatus for carrying out the process as claimed in claim 1, with said apparatus comprising a digitizing device for sectionally digitizing a time signal, a light modulator, and a controller coupled to said digitizing device and said light modulator for representing a sectionally digitized time signal on said light modulator, a source of coherent light arranged to transilluminate said light modulator, and an optical system configured and positioned to focus coherent light from said light modulator into a Fourier plane, and wherein said controller comprises a line controller adapted to write successive digitized sections of the time signal into corresponding successive lines of said light modulator.

9. The apparatus as claimed in claim 8, and further comprising a plurality of said digitizing devices (3) and scanning means coupled to direct digitized time signals (22, 25) from each of said digitizing devices to a different line controller (5) and a corresponding different light modulator (6) (parallel operation).

10. The apparatus as claimed in claim 8 wherein said optical system (9) is designed and arranged in such a way that it represents all the lines (26) of said light modulator (6) on the Fourier plane.

11. The apparatus as claimed in claim 8 wherein said optical system (9) is designed and arranged in such a way that it represents individual selected lines (26) of said light modulator in the Fourier plane.

12. A method of evaluating substantially continuous signals having periodic components with said method comprising the steps of:
 (a) digitizing the signal;
 (b) representing the digitized signal on a multi-line light modulator with each line of the light modulator being occupied by a corresponding digitized section of the signal;
 (c) illuminating the light modulator with coherent light to create the Fourier transformation of the digitized signal represented on the light modulator;
 (d) focusing the Fourier transformation to form an image in a Fourier plane; and
 (e) processing the image in the Fourier plane to extract information about the signal represented on the light modulator.

13. The method of claim 12 and where in step (b) the digitized sections of the signal are represented progressively on corresponding progressive lines of the light modulator as the signal is received and digitized.

14. The method of claim 13 and where in step (b) when all lines of the light modulator have been occupied with representations of corresponding digitized sections of the signal, further digitized sections of the signal are represented on previously occupied lines of the light modulator.

15. The method of claim 12 and wherein the signals to be evaluated include a plurality of signals from different sources and where in step (b) the digitized signal from each source is represented on preselected corresponding lines of the light modulator.

16. The method of claim 12 and wherein step (a) comprises selecting a threshold signal value, interrogating the signal at predetermined intervals, and representing the signal for each interval as a first value if the signal in such interval exceeds the threshold value and as a second value if the signal in such interval falls below the threshold value whereby the signal is digitized in a binary form that can be represented on lines of the light modulator as corresponding opaque and transparent segments.

17. The method of claim 12 and wherein step (a) comprises interrogating the signal at predetermined intervals and assigning a value to each interval that corresponds to the amplitude of the signal in such interval whereby the signal is digitized in a multi-level form that can be represented on lines of the light modulator as segments of corresponding degrees of transparency and opacity.

* * * * *